United States Patent [19]

Baum

[11] Patent Number: 4,775,801

[45] Date of Patent: Oct. 4, 1988

[54] ELECTRONIC TIMER

[76] Inventor: Mitchell H. Baum, 139-15 28th Rd., Flushing, N.Y. 11354

[21] Appl. No.: 44,575

[22] Filed: May 1, 1987

[51] Int. Cl.$^4$ .................... H01H 43/04; H03K 17/284
[52] U.S. Cl. ...................................... 307/141; 307/603; 307/109; 307/141.4; 368/107; 368/89
[58] Field of Search .................. 320/1; 307/141, 141.4, 307/108, 109, 571, 584, 595, 597, 602, 603

[56] References Cited

U.S. PATENT DOCUMENTS

| | | | |
|---|---|---|---|
| 3,193,803 | 7/1965 | Hoffman | 320/1 |
| 3,614,543 | 10/1971 | Dick | 307/141.4 |
| 4,521,705 | 6/1985 | Bartels | 307/141.4 |
| 4,523,103 | 6/1985 | Zirkl | 307/141 |

Primary Examiner—Bernard Roskoski
Attorney, Agent, or Firm—Richard L. Miller

[57] ABSTRACT

A self contained electronic timer device for controlling the length of time that a peripheral device connected to the timer will operate. The timer has a novel way of use a capacitor bank with charge ladling so that a precision time can be selected with a minimal of cheap components.

3 Claims, 1 Drawing Sheet

U.S. Patent  Oct. 4, 1988  4,775,801
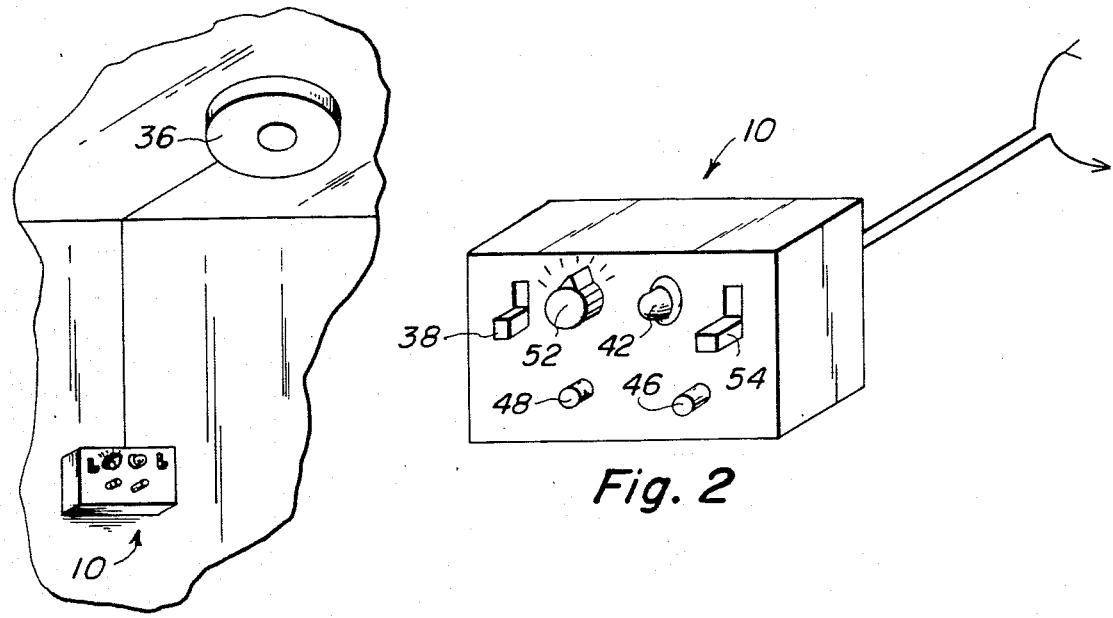
Fig. 1
Fig. 2
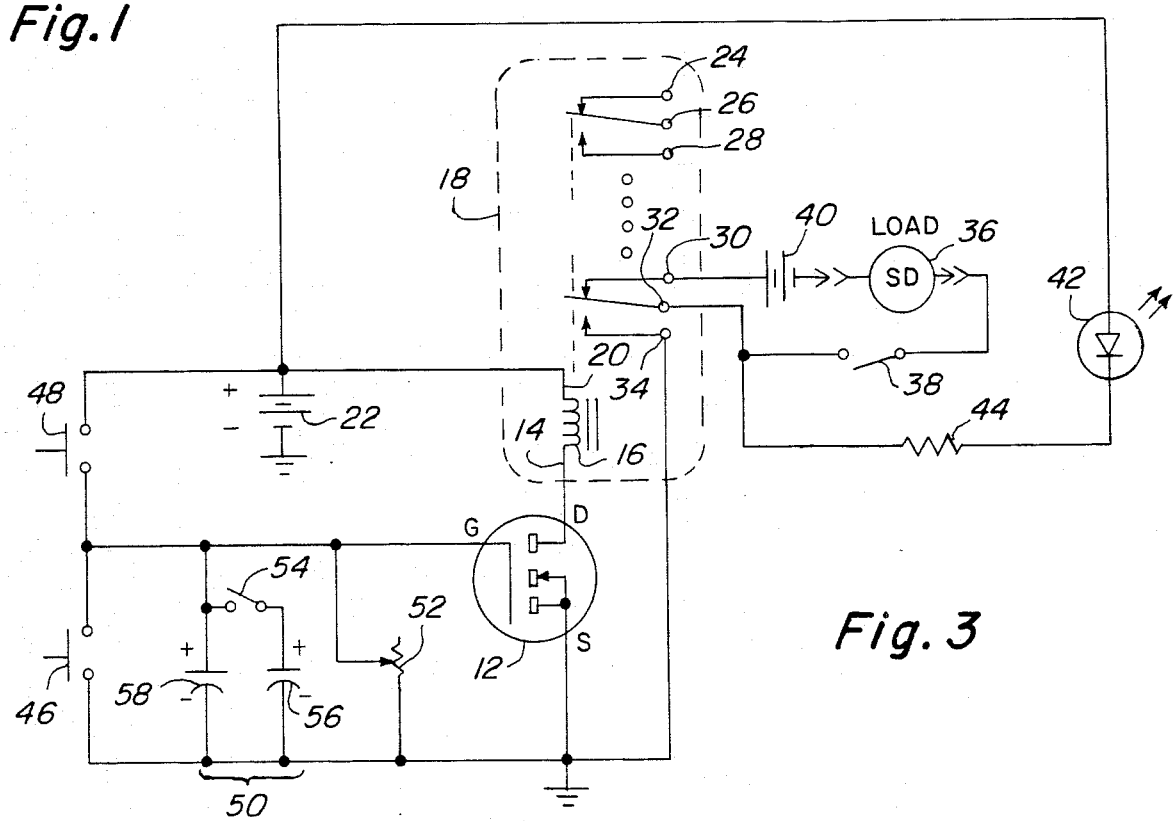
Fig. 3

ELECTRONIC TIMER

BACKGROUND OF THE INVENTION

The instant invention relates generally to timers, and more specifically to electronic timers utilizing all solid state components.

Numerous electronic timers have been provided in the prior art that are designed to be suitable to various requirements of the user. Many of these timers are built integral within a specific device such as clock radios, television sets, alarm clocks, photographic processing equipment, etcetera. While these timer mechanism are suitable for the particular purpose for which they are designed, they are not suitable for the purpose of the present invention as hereafter described.

SUMMARY OF THE INVENTION

A primary object of the present invention is to provide an electronic timer that will overcome the shortcomings of the prior art devices.

Another object is to provide an electronic timer which is a unit by it self and into which any desired appliance, processing equipment, computer, alarm system, or other user device can connected so that the user may select a predetermined length of operating time for a device thus connected to the timer.

An additional object is to provide an electronic timer with virtually no moving parts, is silent, light weight, self-contained.

A further object is to provide an electronic timer that is simple and easy to use.

A still further object is to provide an electronic timer that is economical in cost to manufacture.

Further objects of the invention will appear as the description proceeds.

To the accomplishment of the above and related objects, this invention may be embodied in the form illustrated in the accompanying drawings, attention being called to the fact, however, that the drawings are illustrated only and that changes may be made in the specific construction illustrated and described within the scope of the appended claims.

BRIEF DESCRIPTION OF THE DRAWING FIGURES

The figures in the drawings are briefly described as follows:

FIG. 1 is a perspective view of the instant invention illustrated being used typically with a smoke detector.

FIG. 2 is an enlarged perspective view of the invention per se.

FIG. 3 is an electrical schematic diagram of the invention.

DETAILED DESCRIPTION OF THE PREFERRED EMBODIMENTS

Turning now descriptively to the drawings, in which like reference characters denote like elements throughout the several views, FIG. 3 shows a (metal-oxide-semiconductor field-effect transistor) MOSFET 12 gating device, with the drain terminal D connected to one side 14 of a coil 16 of a relay 18. The other side 20 of the coil 16 is connected to a source of power 22, in this drawing illustrated as the positive terminal of a battery. The negative terminal of the battery 22 is like wise connected to ground along with the source terminal S of the MOSFET 12, and a number of other components so that when the MOSFET conducts the coil 16 of relay 18 is enerigized and any peripheral devices which are connected to the terminals 24, 26, 28, 30, 32 and 34 of relay 18 are either activated or deactivated depending upon the specific type of connection arrangement employed.

A typical load device shown connected to the instant invention 10 is a smoke detector 36, which is in series with both a switch 38 contained within the timer 10 it self, and a second battery 40 when typically could be housed within either smoke detector 36 or the timer as may be determined by other requirements beyond the scope of this explanation.

Also connected between the positive terminal of battery 22, and one blade of relay 18 is the series combination of a (light emitting diode) LED 42 and a current limiting resistor 44. Thus as easily observable from FIG. 3, whenever the coil 16 of relay 18 is energized sufficiently to cause the normally open contacts of relay 18 to close the LED 42 will emit light so as to positively indicate to the user that the relay is in an energized state.

It should be noted that the relay may have any number of contact pairs as may be dictated by particular individual user design requirements and typically terminals 24, 26, and 28 illustrate such.

Having thus described the more mundane portion of the circuitry that is the portion which deals with the control of power to various devices, the description which will follow will describe the really clever portion that is how various lengths of time may be set and adjusted as required by the user.

The MOSFET 12 gating is caused to conduct between the drain D and source S when ever there is hardly any a positive bias potential on the control terminal gate G with respect to source S.

To establish a positive bias between G and S a capacitor bank 50 of at least two capacitors and a variable resistor 52 are all connected in parallel combination with G and S. A first normally open momentary push button switch 46 is connected across the capacitor bank so that all charge may be removed when desired. A second normally open momentary push button switch 48 is connected between the battery 22 and the capacitor bank 50 so that the bank may be charged to the full potential of the battery at will, as is readily obvious from the schematic of FIG. 3. The variable resistor 52 which maybe a precision calibrated device allows the bank to be discharged at a known rate. Switch 54 allows capacitor 56 to be paralleled with capacitor 58 so as to increase or decrease the size of the capacitor bank 50.

What is not obvious at a first glance is the precision way in which charge may be ladled into one of the capacitor of the bank so that exact time setting associated therewith may be set. In order to illustrate this charge ladling procedure a hypothetical example is as follows:

For the purposes of this example assume that battery 22 is eight volts and that both capacitors 56, and 58 are equal and have a value of one mfd each.

(1) Button 46 is depressed while switch 54 is closed and all charge is removed from the bank.

(2) Variable resistor 52 is run off the end of the resistor element so that the resistor is effectively open circuited.

(3) Button 48 is depressed and both capacitors in the bank are charged to eight volts. If the variable resistor is set to a specific value N, then the time setting is proportional to is 8×2×N.

(4) If the switch 54 is opened before the button 48 is depressed, then the time setting its proportional to is 8×N. This is because just one capacitor is in the bank.

(5) If the switch 46 is momentarily depressed while 54 is still open, and then after releasing 46, switch 54 is momentarily depressed the potential of eight volts left on capacitor 58 will be split in half and the new potential of the bank will be four volts. If the variable resistor is now set to a specific value N, then the time setting is approximately proportional to is 4×N.

(6) If the last step 5 is repeated again before setting the resistor each time the potential on the bank will be halved, that is the time setting will be approximately proportional to is 2×N, 1×N, etc.

Naturally with different values of capacitors or with more than two capacitors in the bank a much finer magnitude of settings can be had.

While certain novel features of this invention have been shown and described and are pointed out in the annexed claims, it will be understood that various omissions, substitutions and changes in the forms and details of the device illustrated and in its operation can be made by those skilled in the art without departing from the spirit of the invention.

What is claimed is:

1. An electronic timer device comprising:
    a relay having a coil and contact switches controlled by the energization of the coil;
    said coil having one end thereof connected in a series to an electric gating means in the form of a MOS-FET which includes a drain, a source, and a gate, said relay being connected to the drain;
    a voltage source coupled across another end of the relay and the source;
    a timing circuit coupled between the gate and the source and comprising a first capacitor, at least one additional capacitor selectively connectable in parallel to the first capacitor, a variable resistor coupled in parallel with said capacitors, a first switch coupled in parallel across said capacitors, and a second switch coupled between the other end of the relay and the gate, whereby through closure of the switches and inclusion of a selected number of capacitors, a particular potential and a particular time constant is selected for the timing circuit whereby said electronic gating means will be responsive to said selected particular potential time constant and cause said relay to be energized from said voltage source after a time proportional to the product of said particular potential and particular time constant.

2. An electronic timer device as recited in claim 1, further comprising means for indicating to a user when said relay is energized and de-energized.

3. An electronic timer device as recited in claim 2, wherein said means for indicating to a user when said relay is energized and de-energized, is a LED connected in series with a contact switches of said relay and said voltage source, whereby said LED is caused to emit light when said relay coil is energized sufficiently to cause said contact switches to be held closed.

* * * * *